United States Patent
Lee et al.

(10) Patent No.: US 11,398,607 B2
(45) Date of Patent: Jul. 26, 2022

(54) WINDOW MEMBER AND DISPLAY DEVICE INCLUDING THE SAME

(71) Applicant: Samsung Display Co., Ltd., Yongin-si (KR)

(72) Inventors: Jeoungsub Lee, Seoul (KR); Heonjung Shin, Hwaseong-si (KR); Hye-Jin Oh, Asan-si (KR); Min-Hoon Choi, Seoul (KR); Kyungtae Kim, Asan-si (KR); Boa Kim, Icheon-si (KR); Sanghoon Kim, Hwaseong-si (KR); Sang-Il Park, Yongin-si (KR); Hyunjoon Oh, Seongnam-si (KR); Junghoon Han, Uiwang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 130 days.

(21) Appl. No.: 15/957,659

(22) Filed: Apr. 19, 2018

(65) Prior Publication Data

US 2019/0036048 A1    Jan. 31, 2019

(30) Foreign Application Priority Data

Jul. 27, 2017    (KR) .................. 10-2017-0095673

(51) Int. Cl.
| | | |
|---|---|---|
| *H01L 51/00* | (2006.01) | |
| *H01L 51/52* | (2006.01) | |
| *C09D 175/04* | (2006.01) | |
| *B32B 27/06* | (2006.01) | |

(Continued)

(52) U.S. Cl.
CPC ............ *H01L 51/0097* (2013.01); *B32B 7/12* (2013.01); *B32B 27/06* (2013.01); *C09D 175/04* (2013.01); *H01L 51/5237* (2013.01); *B32B 2255/26* (2013.01); *B32B 2307/546* (2013.01); *B32B 2457/20* (2013.01); *H01L 27/3244* (2013.01); *H01L 51/5253* (2013.01); *H01L 2251/5338* (2013.01); *Y10T 428/24* (2015.01); *Y10T 428/31* (2015.01)

(58) Field of Classification Search
CPC .............. C09D 175/04; H01L 51/0097; H01L 51/5237; H01L 2251/5338; H01L 27/3244; H01L 51/5253; B32B 7/12; B32B 27/06
See application file for complete search history.

(56) References Cited

U.S. PATENT DOCUMENTS

| | | | |
|---|---|---|---|
| 9,661,114 B2 | 5/2017 | Jeong et al. | |
| 2010/0177020 A1* | 7/2010 | Bemelmans | G09F 9/30 345/55 |

(Continued)

FOREIGN PATENT DOCUMENTS

| | | | |
|---|---|---|---|
| KR | 10-2015-0061965 A | 6/2015 | |
| KR | 10-2015-0088101 A | 7/2015 | |

(Continued)

*Primary Examiner* — Frank J Vineis
*Assistant Examiner* — Laura B Figg
(74) *Attorney, Agent, or Firm* — Lewis Roca Rothgerber Christie LLP

(57) ABSTRACT

A window member may include a first member and a second member on the first member. A recovery rate of the second member may be 40% or more, and an absolute value of difference in recovery rate between the first and second members may be 45% or less.

21 Claims, 8 Drawing Sheets

(51) Int. Cl.
    *B32B 7/12*       (2006.01)
    *H01L 27/32*    (2006.01)

(56)           References Cited

U.S. PATENT DOCUMENTS

| | | | |
|---|---|---|---|
| 2015/0049428 A1* | 2/2015 | Lee | G06F 1/1652 |
| | | | 361/679.27 |
| 2015/0093568 A1 | 4/2015 | Kim et al. | |
| 2015/0147532 A1 | 5/2015 | Nam et al. | |
| 2015/0201487 A1* | 7/2015 | Kee | G02F 1/133305 |
| | | | 361/749 |
| 2017/0036242 A1 | 2/2017 | Lee et al. | |
| 2017/0338286 A1 | 11/2017 | Oh et al. | |

FOREIGN PATENT DOCUMENTS

| | | | | |
|---|---|---|---|---|
| KR | 10-2016-0071174 A | 6/2016 | | |
| KR | 10-2017-0016297 A | 2/2017 | | |
| KR | 10-2017-0017734 A | 2/2017 | | |
| WO | WO-2016196458 A2 * | 12/2016 | ............. | B32B 25/14 |

\* cited by examiner

WINDOW MEMBER AND DISPLAY DEVICE INCLUDING THE SAME

CROSS-REFERENCE TO RELATED APPLICATIONS

This patent application claims priority to and the benefit of Korean Patent Application No. 10-2017-0095673, filed on Jul. 27, 2017, in the Korean Intellectual Property Office, the entire content of which is hereby incorporated by reference.

BACKGROUND

The present disclosure relates to a window member and a display device including the same.

Certain electronic products (such as mobile communication terminals, digital cameras, notebook computers, monitors, and television sets) include a display device configured to display an image.

The display device includes a display panel, which is configured to generate and display an image, and a window panel, which is provided on the display panel and is used to protect the display panel. Various display panels, such as a liquid crystal display (LCD) device, an organic light emitting display (OLED) device, an electrowetting display (EWD) device, a plasma display panel (PDP) device, and an electrophoretic display (EPD) device, have been developed as the display panel. The display panel may also be configured to have a touch sensing function.

The window panel is attached to a top surface of the display panel. That is, the window panel is located on a propagating path of light transmitted from the display panel to an observer of the display panel. In addition, the window panel is used to protect internal functional layers from an external impact, and for this reason, the window panel has the highest risk of breakage from the external impact. Also, in the case where the window panel is used for a flexible display device, the window panel should have a very small thickness so as to realize a foldable property, and this makes the window panel even more vulnerable to the external impact.

SUMMARY

Aspects of embodiments of the inventive concept are directed toward a rollable window member with an improved impact resistance property and a display device including the same.

According to some embodiments of the inventive concept, a window member may include a first member and a second member provided on the first member. A recovery rate of the second member may be 40% or more, and an absolute value of difference in recovery rate between the first and second members may be 45% or less.

In some embodiments, the recovery rate may be measured from the window member that is stretched by 5%.

In some embodiments, the second member may have a modulus larger than that of the first member.

In some embodiments, the modulus of the first member may be 1 MPa or less, and the modulus of the second member may be 100 MPa or more.

In some embodiments, a thickness ratio between the first and second members may be 1:1.

In some embodiments, the window member may be configured to be rolled around an axis extending in an axial direction of the rolled window member.

In some embodiments, the first member may be rolled with a curvature radius that is less than that of the second member.

In some embodiments, the second member may have a hardness larger than that of the first member.

In some embodiments, each of the first and second members may include at least one of silicone-, urethane-, and acryl-based materials.

According to some embodiments of the inventive concept, a display device may include a display panel, and a window member provided on the display panel. The window member may include a first member, which is provided to have a first modulus, and a second member, which is provided on the first member and has a second modulus larger than the first modulus. A recovery rate of the second member may be 40% or more, and an absolute value of difference in recovery rate between the first and second members may be 45% or less.

In some embodiments, the recovery rate may be measured from the window member that is stretched by 5%.

In some embodiments, the first modulus may be 1 MPa or less, and the second modulus may be 100 MPa or more.

In some embodiments, a thickness ratio between the first and second members may be 1:1.

In some embodiments, each of the first and second members may include at least one of silicone-, urethane-, and acryl-based materials.

In some embodiments, the display panel and the window member may be configured to be rolled around an axis extending in an axial direction of the rolled window member with a curvature radius.

In some embodiments, the curvature radius may be equal to or less than 10 mm.

In some embodiments, a curvature radius of the first member may be less than that of the second member, when the window member is in a rolled state.

In some embodiments, a hardness of the second member may be larger than that of the first member.

In some embodiments, the display device may further include a protection panel provided below the display panel.

In some embodiments, the display device may further include an adhesive member provided between the display panel and the protection panel.

BRIEF DESCRIPTION OF THE DRAWINGS

Example embodiments will be more clearly understood from the following brief description taken in conjunction with the accompanying drawings. The accompanying drawings represent non-limiting example embodiments as described herein.

Figure 1:
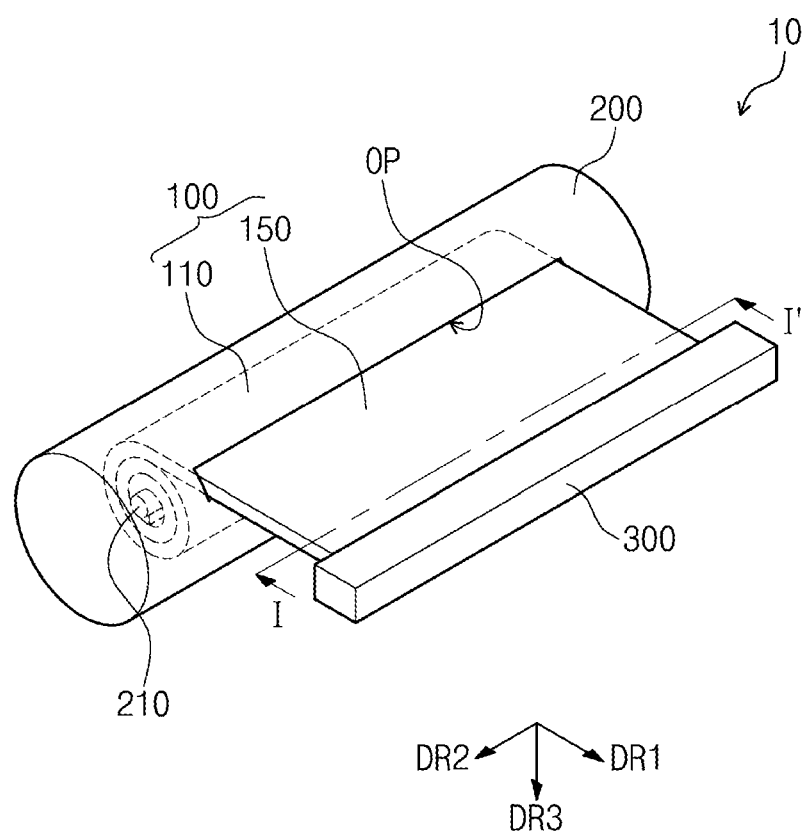
FIGS. 1 and 2 are perspective views schematically illustrating a rollable display device according to some embodiments of the inventive concept.

It should be noted that these figures are intended to illustrate the general characteristics of methods, structure and/or materials utilized in certain example embodiments and to supplement the written description provided below. These drawings may not, however, be to scale and may not precisely reflect the precise structural or performance characteristics of any given embodiment, and may not be interpreted as defining or limiting the range of values or properties encompassed by example embodiments. For example, the relative thicknesses and positioning of members, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

The use of "may" when describing embodiments of the present invention refers to "one or more embodiments of the present invention."

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

As used herein, the terms "use," "using," and "used" may be considered synonymous with the terms "utilize," "utilizing," and "utilized," respectively.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
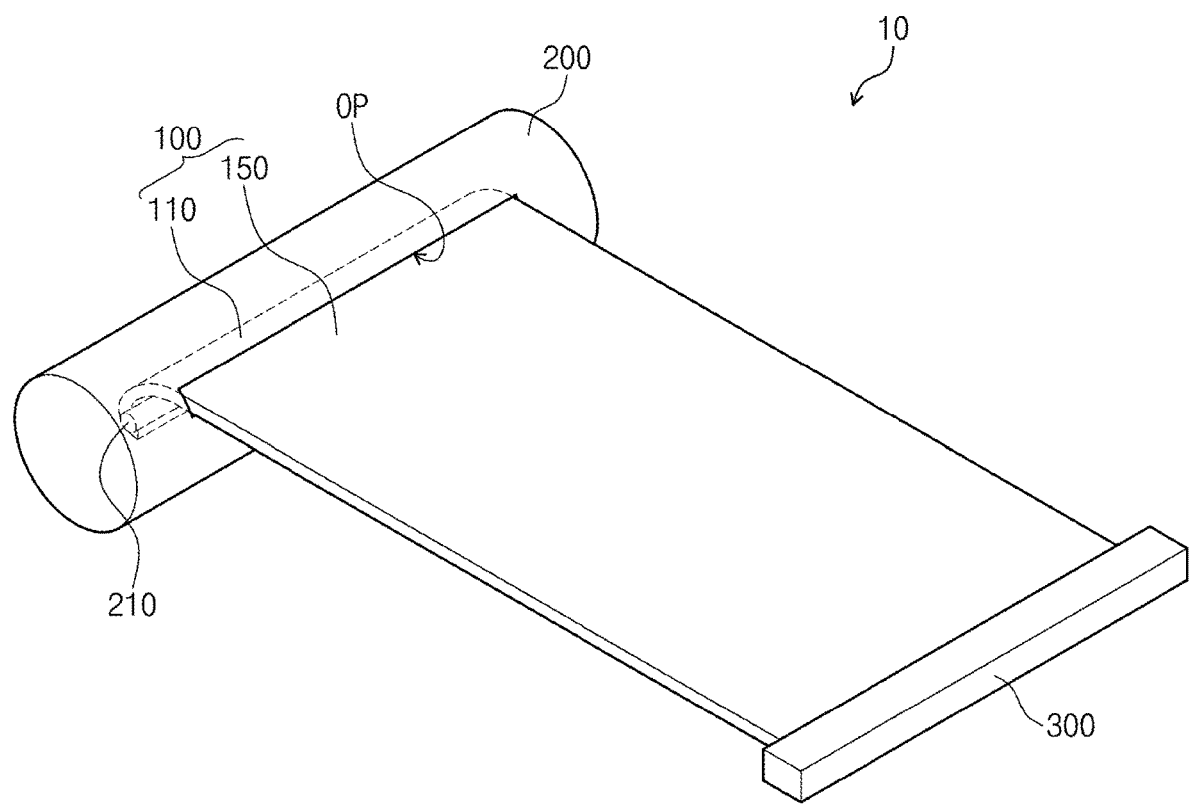
Figure 2:
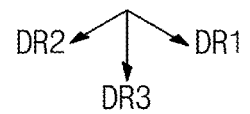

FIGS. 1 and 2 are perspective views schematically illustrating a rollable display device according to some embodiments of the inventive concept.

Referring to FIGS. 1 and 2, a rollable display device 10 according to some embodiments of the inventive concept may include a display device 100 and a housing 200. The display device 100 may be configured to display an image. The housing 200 may have an opening OP. As shown in FIG. 1, the display device 100 may be contained in a rolled state in the housing 200. As shown in FIG. 2, the display device 100 may be pulled by an external force, thereby being exposed to the outside of the housing 200.

The rollable display device 10 may further include a handle 300. In certain embodiments, the handle 300 may be omitted. The handle 300 may be connected to the display device 100.

Referring back to FIG. 1, the display device 100 may include a substrate formed of (e.g., composed of) a flexible material, thereby being flexible. The flexible material for the substrate may include at least one of, for example, polycarbonate (PC), polyethyleneterephthalate (PET), polyethylene (PE), polypropylene (PP), polysulfone (PSF), polymethylmethacrylate (PMMA), triacetyl cellulose (TAC), cyclo olefin polymer (COP), or cyclo olefin copolymer (COC), but it is not particularly limited as long as it is suitable in the art.

The display device 100 may be rolled around at least one rolling axis (e.g., a winding core 210) in the housing 200 or may be unrolled. In the case where an external force is exerted on the display device 100, the display device 100 may be exposed to the outside of the housing 200. For example, the display device 100, which is kept in the rolled state in the housing 200, may be pulled to the outside through the opening OP of the housing 200 by an external force.

The housing 200 may be configured to contain the display device 100 therein. FIGS. 1 and 2 illustrate an example in which the housing 200 has a roughly cylindrical shape, but the inventive concept is not limited thereto. For example, a shape of the housing 200 may be variously changed, if the display device 100 can be rolled and contained in the housing 200. In addition, FIGS. 1 and 2 illustrate an example in which the housing 200 is formed to have a single-body structure, but the inventive concept is not limited thereto. For example, the housing 200 may include two or more sub-housings combined with each other.

The display device 100 may be rolled and contained in the housing 200. For example, the display device 100 may be connected to the winding core 210 of the housing 200, when it is rolled or unrolled. FIGS. 1 and 2 illustrate an example in which the display device 100 is rolled to surround the winding core 210 having a cylindrical shape, but the inventive concept is not limited thereto. For example, the winding core 210 may be configured to include a combination part, and the combination part may be configured to allow the display device 100 to be combined thereto.

FIGS. 1 and 2 illustrate an example in which the winding core 210 is provided to have a single body structure, but the inventive concept is not limited thereto. For example, the winding core 210 may include two or more sub-winding cores combined with each other.

Figure 3:
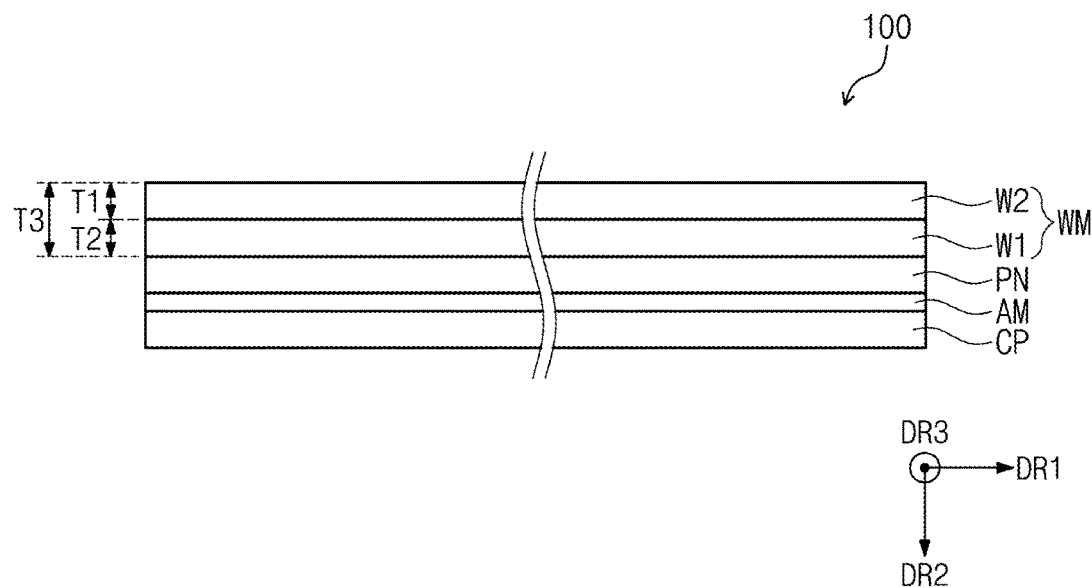
FIG. 3 is a schematic sectional view taken along line I-I' of FIG. 1.
Figure 4:
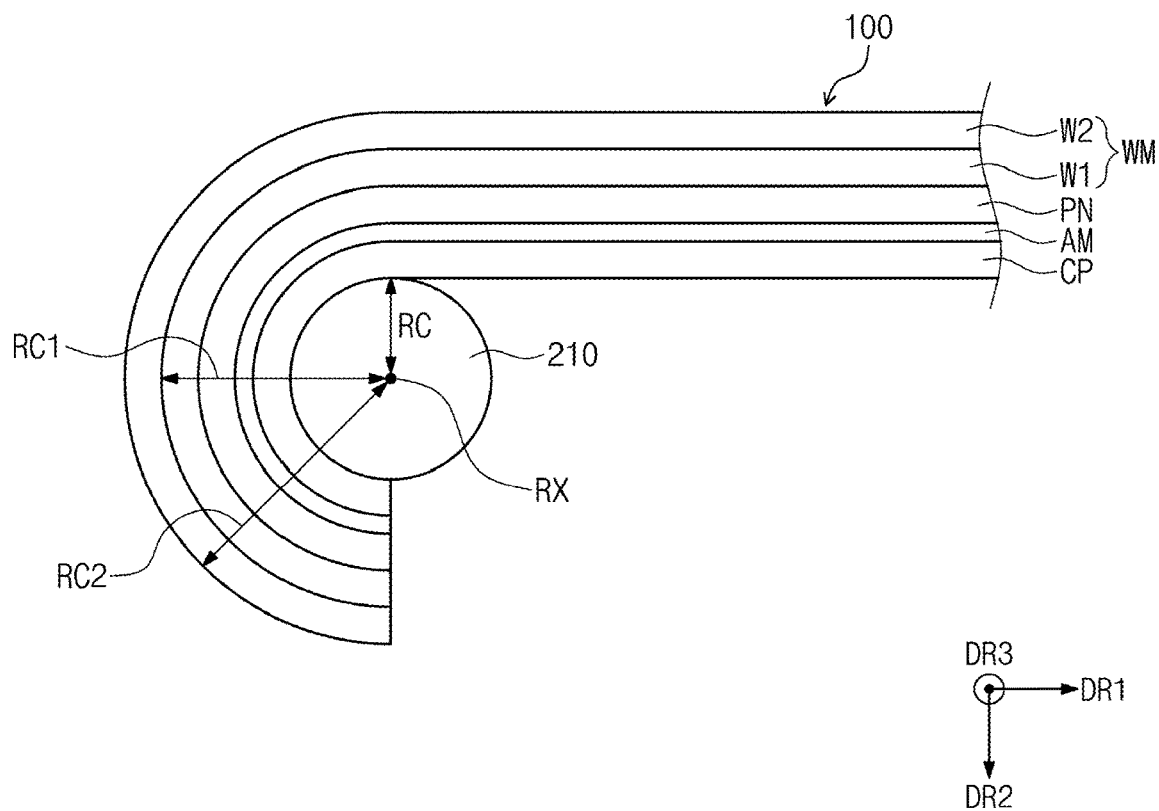
FIG. 4 is a sectional view illustrating a portion of a rollable display device according to some embodiments of the inventive concept.

FIG. 3 is a schematic sectional view taken along line I-I' of FIG. 1, and FIG. 4 is a sectional view illustrating a portion of a display device according to some embodiments of the inventive concept.

The display device 100 may include a lower panel CP, an adhesive member AM, a display panel PN, and a window member WM.

The lower panel CP may be provided in the form of a plate. The lower panel CP is illustrated to have a rectangular shape, when viewed in a plan view, and the inventive concept is not limited to a specific shape and a specific size of the lower panel CP. The lower panel CP may be provided on a rear surface of the display panel PN, and in some embodiments, the lower panel CP may be configured to protect the display panel PN and to have a flexible property. The lower panel CP may be configured to improve impact resistance of the display panel PN. Since the display device 100 includes the lower panel CP, it may be possible to improve durability of the display device 100.

The adhesive member AM may be provided on a front surface of the lower panel CP. The adhesive member AM may be provided between the lower panel CP and the display panel PN. The adhesive member AM may be configured to physically combine the lower panel CP with the display panel PN.

The adhesive member AM may be an adhesive layer, which is formed by coating a liquid adhesive material and then curing the liquid adhesive material, or an adhesion sheet, which is prepared by an additional process. For example, the adhesive member AM may be formed of or include a pressure sensitive adhesive (PSA), an optical clear adhesive (OCA), or an optical clear resin (OCR), but the inventive concept is not limited thereto. For example, in certain embodiments, the adhesive member AM may be omitted.

The display panel PN may be located on the adhesive member AM. The display panel PN may be configured to generate an image, based on input image data. The display panel PN may be a liquid crystal display panel, an organic light emitting display panel, an electrophoretic display panel, or an electrowetting display panel, but the inventive concept is not limited to a specific kind of the display panel PN. The display panel PN may have a flexible property.

The window member WM may be located on the display panel PN. The window member WM may be optically transparent. The window member WM may be configured to protect the display panel PN from an external impact or an external environment.

The window member WM may include a first member W1 and a second member W2 provided on the first member W1. The second member W2 may be configured to have a recovery rate of 40% or higher, and an absolute value of a difference between a recovery rate of the first member W1 and a recovery rate of the second member W2 may be equal to or less than 45%. In the case where the window member WM has the afore-described recovery rate, the window member WM may have a good rollable property and a good effect in suppressing a strain-induced stress. The first member W1 may be configured to relieve an internal stress, which is produced during a rolling operation, and the second member W2 may be configured to provide good scratch-resistance and impact-resistance properties. However, in the case where the recovery rate of the window member WM is beyond the range, a crack may occur by an internal stress during a rolling operation.

Figure 8:
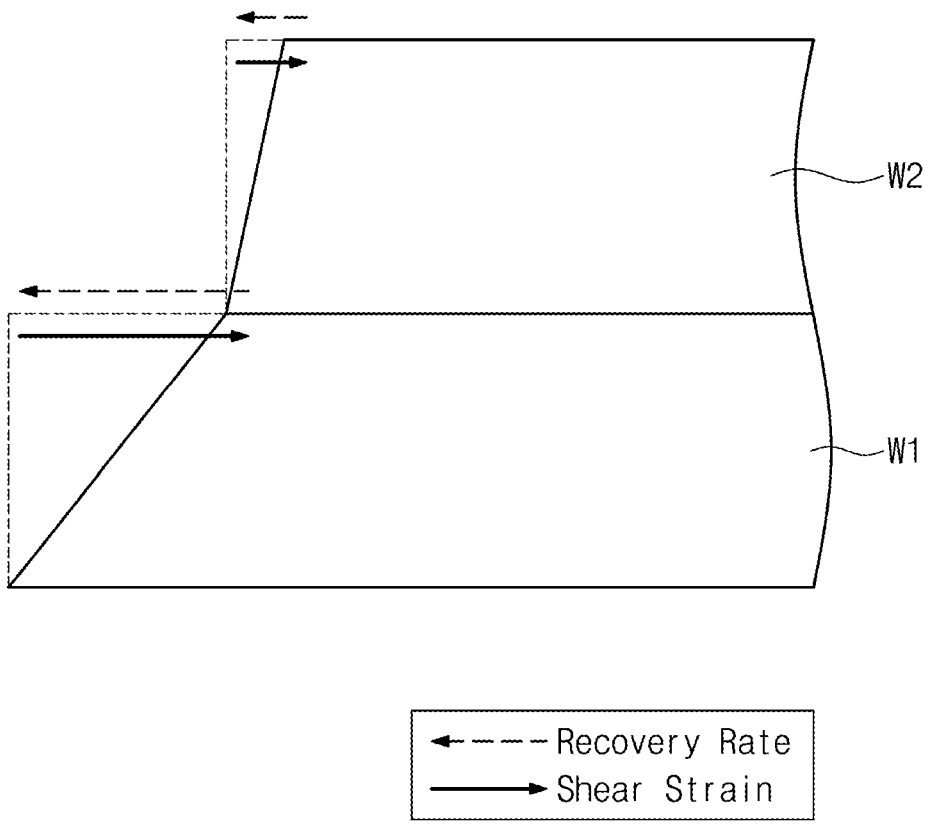
FIG. 8 is a schematic sectional view illustrating a strain rate and a recovery rate in a window member according to some embodiments of the inventive concept.

FIG. 8 is a schematic sectional view illustrating a strain rate and a recovery rate in a window member according to some embodiments of the inventive concept. The recovery rate may be used to express a recovery property of an object. In detail, if a certain force or load is exerted on an object in a horizontal direction, a shearing force acting on infinitesimal parts in the object may lead to dislocation of sides and a change in angle, as shown in FIG. 8, and this is called a shear strain. The recovery rate may be obtained by measuring how much the object is restored when the force is removed.

In the present embodiment, the window member WM was stretched by 5% and was restored after 10 seconds, and the recovery rate was calculated as a residual strain of the restored window member WM. In the stress-strain curve of FIG. 9, the recovery rate was calculated as a residual strain at a stress-free point 'A'.

The display device 100 may be rolled at a specific curvature radius, and the second member W2 may be rolled to face outward. During the rolling of the display device 100, a stress may be exerted on the display device 100. In the case where the first and second members W1 and W2 are formed to have the afore-described recovery rate properties, it may be possible to improve both of flexible and recovery properties of the display device 100.

The first member W1 may have a first modulus, and the second member W2 may have a second modulus lager than the first modulus. In some embodiments, the second member W2 may have hardness larger than that of the first member W1. The modulus may refer to an elastic modulus when the object is stretched, and as the modulus of the second member W2 increases, the second member W2 may have an increased hardness, thereby having improved scratch-resistance, impact-resistance, and recovery properties. By contrast, if the modulus is reduced, the first member W1 may have a more stretchable property, thereby relieving an internal stress caused by a rolling operation. For example, the first modulus may be equal to or less than 1 MPa, but the inventive concept is not limited thereto. The second modulus may be 100 MPa or larger (in particular, 500 MPa or larger, or in more particular, 800 MPa or larger), but the inventive concept is not limited thereto.

As shown in FIG. 3, the first member W1 may have a thickness T1, the second member W2 may have a thickness T2, and the window member WM may have a thickness T3. A ratio in thickness between the first and second members W1 and W2 (i.e., T1:T2) may be 1:1, but the inventive concept is not limited thereto. In the case where the thickness ratio (i.e., T1:T2) is 1:1, the first member W1 may have good hardness to a rolling stress, the second member W2 may have high impact resistance, and thus, it may be possible to stably protect the display panel PN from an external impact. In certain embodiments, the thickness T3 of the window member WM may range from 200 μm to 300 μm, but the inventive concept is not limited thereto. The thicknesses of the first member W1, the second member W2, and the window member WM may be determined according to the modulus of each member.

As shown in FIG. 4, the display device 100 may be rolled at a specific curvature radius RC. The curvature radius RC may be defined as a shortest distance between a curvature center RX and the display device 100.

In the present embodiment, the curvature radius RC may be equal to or less than 10 mm. The display device 100 may have an improved rollable property, even when the curvature radius is small.

Each of the lower panel CP, the adhesive member AM, the display panel PN, and the window member WM constituting the display device 100 may be configured to be rolled around the winding core 210. Here, each of the first and second members W1 and W2 may have a curvature radius that varies depending on a distance from the curvature center RX.

The first member W1 may have a curvature radius different from that of the second member W2. In the present embodiment, since the curvature center RX is closer to the first member W1 than to the second member W2, a curvature radius RC1 of the first member W1 may be less than a curvature radius RC2 of the second member W2.

Typical rubber materials may be used for the first and second members W1 and W2, but the inventive concept is not limited thereto. For example, each of the first and second members W1 and W2 may be formed of or include at least one of silicone-, urethane-, and acryl-based materials, and in certain embodiments, each of the first and second members W1 and W2 may be formed of a urethane-based material. For the sake of simplicity, the description that follows will refer to an example in which the first and second members W1 and W2 are formed of urethane-based materials, but the inventive concept is not limited thereto.

The first member W1 may be formed by coating a urethane-based material (e.g., polyurethane) on the display panel PN and curing the urethane-based material. In addition, the second member W2 may be formed by coating polyurethane on the first member W1 and curing the polyurethane. As described above, the first member W1 may be formed on the display panel PN by a direct coating method, the second member W2 may be formed on the first member W1, and an additional adhesive member may not be used in this process. By contrast, in the case where an adhesive member, not the direct coating method, is used for the attaching of the member, the window member WM may suffer from a low recovery rate, owing to low modulus of the adhesive member.

Figure 5:
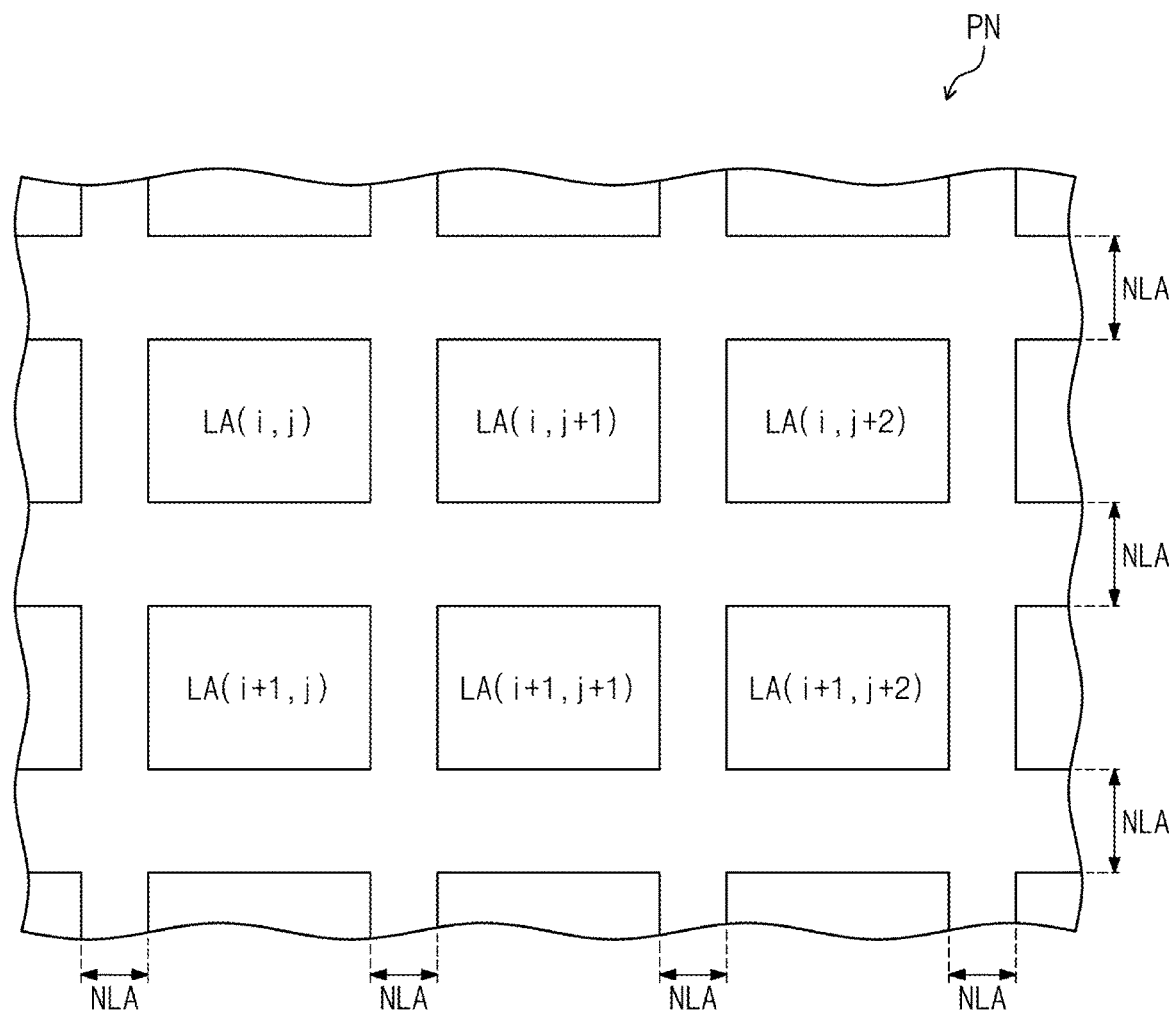
FIG. 5 is a plan view illustrating a portion of a display device according to some embodiments of the inventive concept.
Figure 6:
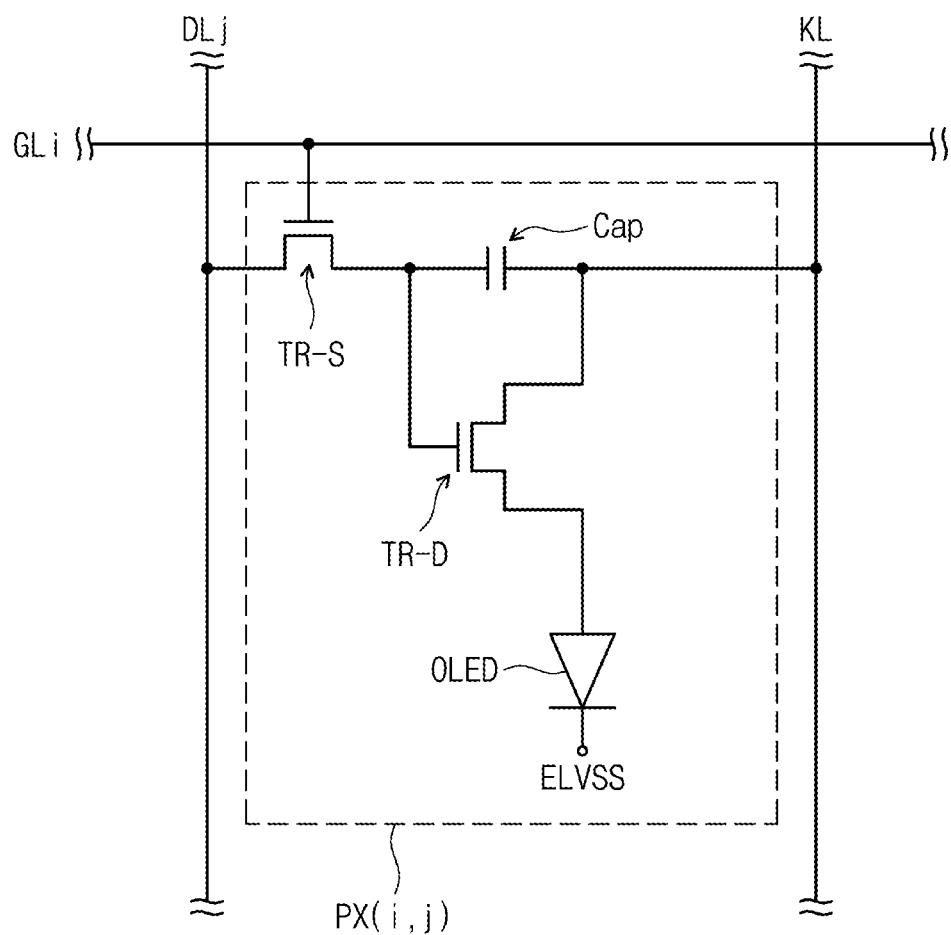
FIG. 6 is an equivalent circuit diagram of a pixel according to some embodiments of the inventive concept.
Figure 7:
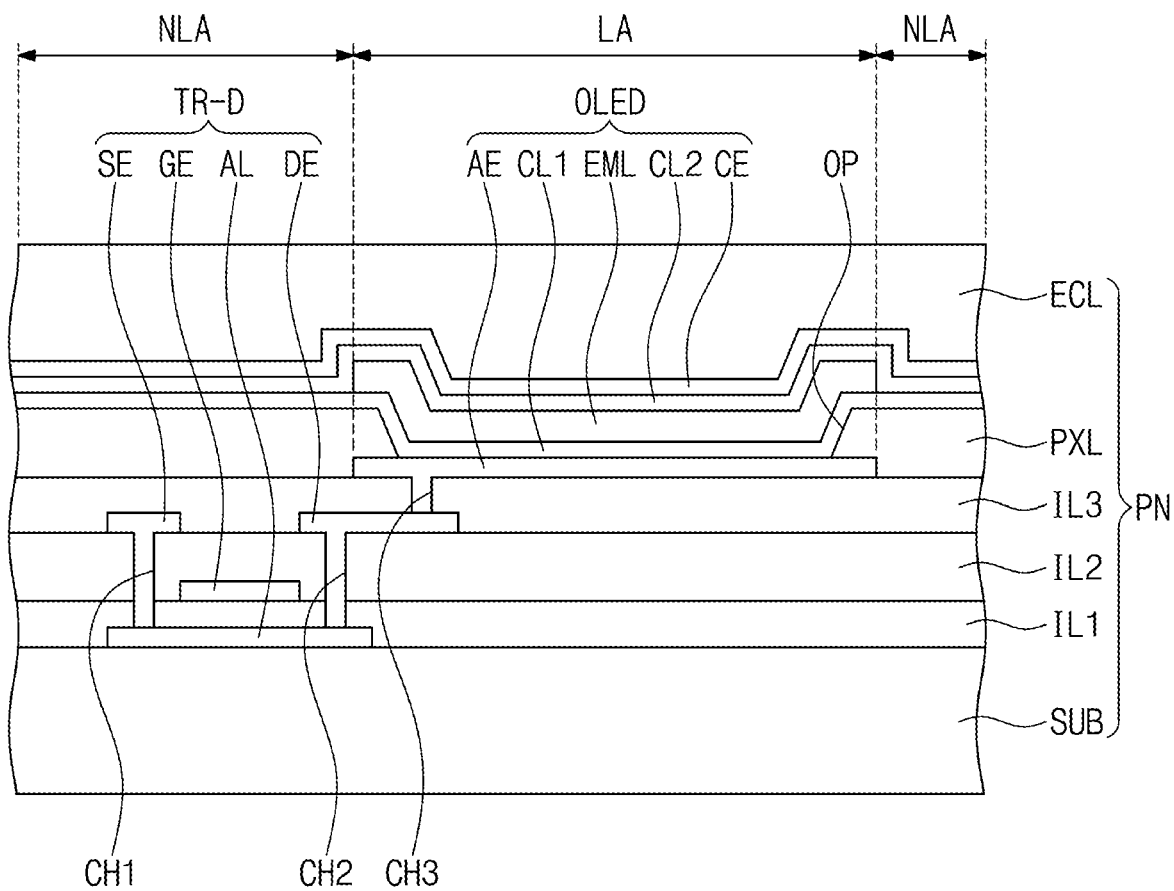
FIG. 7 is a sectional view illustrating a portion of a display device according to some embodiments of the inventive concept.

FIG. 5 is a plan view illustrating a portion of the display device of FIG. 3. FIG. 6 is an equivalent circuit diagram of a pixel according to some embodiments of the inventive concept. FIG. 7 is a sectional view illustrating a pixel according to some embodiments of the inventive concept.

A portion of the display panel PN is schematically illustrated in FIGS. 5 to 7. Hereinafter, a display device according to some embodiments of the inventive concept will be described in more detail with reference to FIGS. 5 to 7.

As shown in FIG. 5, the display panel PN may include a plurality of light-emitting regions LA(i,j)–LA(i+1,j+2) and a non-light-emitting region NLA surrounding the light-emitting regions LA(i,j)–LA(i+1,j+2), when viewed in a plan view. FIG. 5 illustrates a portion in which six light-emitting regions LA(i,j)–LA(i+1,j+2) are provided.

The light-emitting regions LA(i,j)–LA(i+1,j+2) may be configured to emit a specific light. The six light-emitting regions LA(i,j)–LA(i+1,j+2) may be configured to emit lights of the same color or different colors.

The non-light-emitting region NLA may be configured to substantially separate the light-emitting regions LA(i,j)–LA(i+1,j+2) from each other. The non-light-emitting region NLA may prevent light from being emitted to a neighboring region around the light-emitting regions LA(i,j)–LA(i+1,j+2), and this may make it possible to prevent a light leakage problem and to more clearly separate the light-emitting regions LA(i,j)–LA(i+1,j+2) from each other.

A display element generating light may be provided in each of the light-emitting regions LA(i,j)–LA(i+1,j+2). In the present embodiment, the display element may be an organic light emitting device. Signal lines may be provided to be overlapped with the non-light-emitting region NLA and may be used to provide electrical signals to the display elements.

An equivalent circuit of pixel PX(i,j) is illustrated in FIG. 6. The pixel PX(i,j) may include at least one thin-film transistor and a display element. FIG. 6 illustrates an example in which an organic light emitting device OLED is used as the display element. However, the structure of the pixel PX(i,j) is not limited to that of FIG. 6 and may be variously changed.

The pixel PX(i,j) may receive gate signals from an i-th gate line GLi and may receive data signals from a j-th data line DLj. The pixel PX(i,j) may receive a first power voltage ELVDD from a power line KL. The pixel PX(i,j) may include a switching thin-film transistor TR-S, a driving thin-film transistor TR-D, and a capacitor Cap, which are used as a circuit part for driving the organic light emitting device OLED.

The switching thin-film transistor TR-S may be configured to output the data signal applied to the j-th data line DLj, in response to the gate signals applied to the i-th gate line GLi. The capacitor Cap may be charged to a voltage level corresponding to the data signal transmitted through the switching thin-film transistor TR-S.

The driving thin-film transistor TR-D may be connected to the organic light emitting device OLED. The driving thin-film transistor TR-D may control a driving current flowing through the organic light emitting device OLED, based on an amount of electric charges stored in the capacitor Cap. The organic light emitting device OLED may be configured to emit light, when the driving thin-film transistor TR-D is in a turn-on period.

For convenience in illustration, FIG. 7 illustrates a vertical section of a portion, on which the driving thin-film transistor TR-D and the organic light emitting device OLED of FIG. 6 are provided. As shown in FIG. 7, insulating layers IL1, IL2, and IL3, the driving thin-film transistor TR-D, and the organic light emitting device OLED may be provided on a base substrate SUB.

The base substrate SUB may have flexible and insulating properties. For example, the base substrate SUB may be formed of or include a resin containing polyimide (PI).

A semiconductor pattern AL of the driving thin-film transistor TR-D may be provided on the base substrate SUB. The first insulating layer IL1 may be provided on the base substrate SUB to cover the semiconductor pattern AL. The first insulating layer IL1 may include an organic layer and/or an inorganic layer. The first insulating layer IL1 may include a plurality of layers.

A control electrode GE of the driving thin-film transistor TR-D may be provided on the first insulating layer IL1. The second insulating layer IL2 may be provided on the first insulating layer IL1 to cover the control electrode GE. The second insulating layer IL2 may include an organic layer and/or an inorganic layer. The second insulating layer IL2 may include a plurality of layers.

An input electrode SE and an output electrode DE of the driving thin-film transistor TR-D may be provided on the second insulating layer IL2. The input electrode SE and the output electrode DE may be connected to respective portions of the semiconductor pattern AL through a first through hole CH1 and a second through hole CH2, which are formed to penetrate both of the first insulating layer IL1 and the second insulating layer IL2. Meanwhile, in certain embodiments, the driving thin-film transistor TR-D may be configured to have a bottom gate structure.

The third insulating layer IL3 may be provided on the second insulating layer IL2 to cover the input electrode SE and the output electrode DE. The third insulating layer IL3 may include an organic layer and/or an inorganic layer. The third insulating layer IL3 may include a plurality of layers.

A pixel definition layer PXL and the organic light emitting device OLED may be provided on the third insulating layer IL3. The organic light emitting device OLED may include a first electrode AE, a first common layer CL1, an organic light emitting layer EML, a second common layer CL2, a second electrode CE, which are sequentially stacked on the base substrate SUB. The first electrode AE may be connected to the output electrode DE through a third through hole CH3 penetrating the third insulating layer IL3. According to a light-emitting direction of the organic light emitting device OLED, positions of the first electrode AE and the second electrode CE may be exchanged with each other, and positions of the first common layer CL1 and the second common layer CL2 may be exchanged with each other.

The first electrode AE may be provided on the third insulating layer IL3. The opening OP of the pixel definition layer PXL may be provided to expose at least a portion of the first electrode AE.

The first common layer CL1 may be provided on the first electrode AE. The first common layer CL1 may be provided not only on the light-emitting region LA corresponding to the opening OP, but also on the non-light-emitting region NLA. The first common layer CL1 may be a hole control region. The first common layer CL1 may be used to effectively control the motion of holes and to realize the motion of holes balanced with the motion of electrons. The first common layer CL1 may include a hole transport material.

The organic light emitting layer EML may be provided on the first common layer CL1. The organic light emitting layer EML may be locally on the opening OP. The second common layer CL2 may be provided on the organic light emitting layer EML. The second common layer CL2 may include an electron injection layer. The second common layer CL2 may be an electron control region. The second common layer CL2 may be used to effectively control the motion of electrons and to balance the motion of electrons with the motion of holes. The first common layer CL1 may include an electron transport material.

The second electrode CE may be provided on the second common layer CL2. The second electrode CE may be provided not only on the light-emitting region LA corresponding to the opening OP, but also on the non-light-emitting region NLA.

An encapsulation layer ECL may be provided on the second electrode CE. The encapsulation layer ECL may be overlapped with both of the light-emitting region LA and the non-light-emitting region NLA. The encapsulation layer ECL may include an organic layer and/or an inorganic layer. In certain embodiments, a fourth insulating layer with a flat top surface may be provided between the second electrode CE and the encapsulation layer ECL. In certain embodiments, the encapsulation layer ECL may be replaced with an encapsulation substrate.

In one embodiment, the switching thin-film transistor TR-S may have the same structure as the driving thin-film transistor TR-D. Two electrodes of the capacitor Cap may be provided on the first insulating layer IL1, the second insulating layer IL2, and the third insulating layer IL3.

Hereinafter, some embodiments of the inventive concept will be described in more detail below, but the inventive concept is not limited to the following embodiments.

Embodiment 1

An adhesive member was disposed on a 100-μm thick thermoplastic polyurethane film, and then, a display panel was attached to the adhesive member. Next, a 100-μm thick polyurethane coating was coated on the display panel and was cured to form a first member having a recovery rate of 91.2%. Another 100-μm thick polyurethane coating was coated on the first member and was cured to form a second member having a recovery rate of 50.1%. As a result, a window member according to the embodiment 1 was formed.

Figure 9:
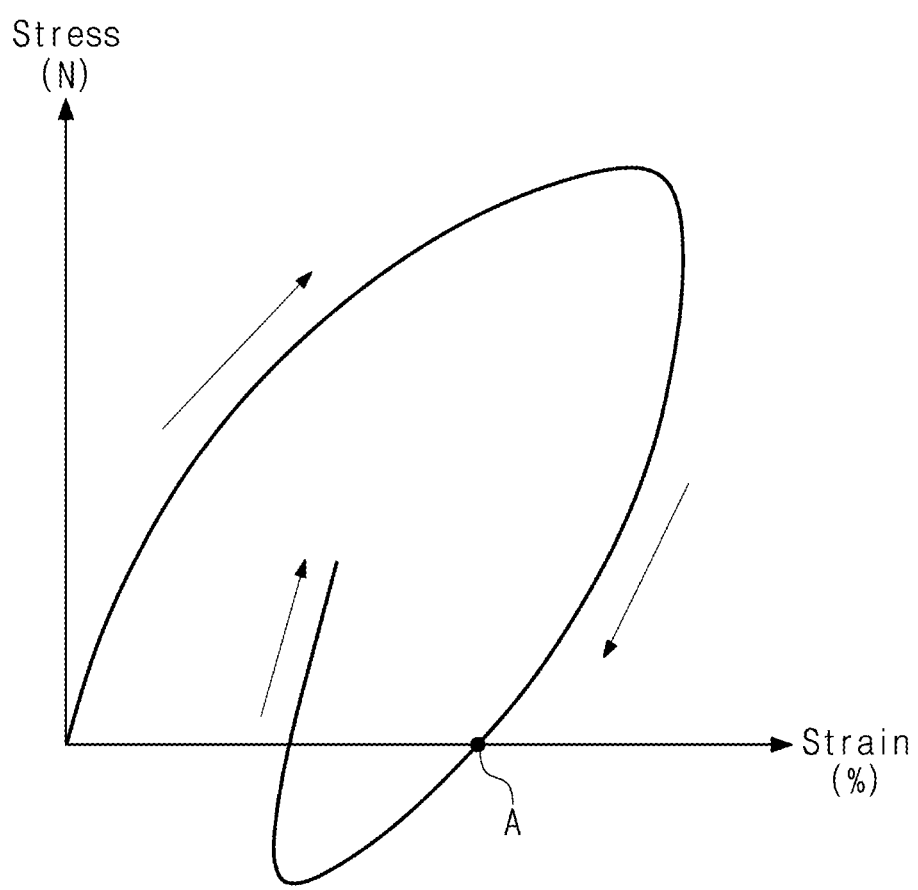
FIG. 9 is a graph illustrating a stress-strain curve of a window member according to some embodiments of the inventive concept.

Here, the window member was stretched by 5% at a speed of 1.52 mm/s and was restored after 10 seconds, and the recovery rate was calculated as a residual strain rate (e.g., at a point 'A' of FIG. 9).

Embodiments 2 to 6

The display devices according to embodiments 2 to 6 were fabricated in such a way that the first member and the second member had recovery rates shown in the following table 1. Except for these differences in the recovery rates, the display devices were fabricated using the same method as that in the embodiment 1.

Comparative Embodiments 1 to 6

The display devices according to comparative embodiments 1 to 6 were fabricated in such a way that the first member and the second member had recovery rates shown in the following table 1. Except for these differences in the recovery rates, the display devices according to comparative embodiments 1 to 6 were fabricated using the same method as that in the embodiment 1.

[Experimental Example 1] Evaluation of Rolling Property

Each of the display devices, according to the embodiments 1 to 6 and the comparative embodiments 1 to 6, was rolled at a curvature radius of 10 mm. Here, the second member was inspected to determine whether there was a crack therein, and the results are illustrated in the following table 1.

In the cases (i.e., the embodiments 1 to 6) where the second member had a recovery rate of 40% or higher and an absolute value of difference in recovery rate between the first and second members was less than 45%, a crack was not formed in the second member when the display device was rolled. By contrast, in the cases (i.e., the comparative embodiments 1 to 6) where the second member had a recovery rate of 40% or lower and the absolute value of difference in recovery rate between the first and second members was larger than 45%, a crack was formed in the second member, when the display device was rolled.

For comparison, in the embodiment 2 in which the recovery rate of the first member was 45.6% and the absolute value of difference in recovery rate between the first and second members was 37.5%, a crack was not formed in the second member when the display device was rolled, and in the comparative embodiments 3 to 5 in which the recovery rate of the first member was 45.6% and the absolute value of difference in recovery rate between the first and second members was larger than 45%, a crack was formed in the second member when the display device was rolled.

Comparing the embodiment 5 with the comparative embodiment 2, the recovery rates of the second member were the same, but the absolute values of difference in recovery rate between the first and second members were different. Here, in the embodiment 5 in which the absolute value of difference in recovery rate between the first and second members was 22.1%, a crack was not formed in the second member when the display device was rolled, but in the comparative embodiment 2 in which the absolute value of difference in recovery rate between the first and second members was 98.5% (i.e., larger than 45%), a crack was formed in the second member when the display device was rolled.

Like this, in the case where the recovery rate of the second member was 40% and the absolute value of difference in recovery rate between the first and second members was less than 45%, a crack was not formed in the second member which was an outer layer, and thus, a rollable property of the display device was improved when the display device was rolled.

TABLE 1

|  | Recovery rate of first member (%) | Recovery rate of second member (%) | Δ in recovery rate between first and second members | Occurrence of crack |
| --- | --- | --- | --- | --- |
| Embodiment 1 | 91.2 | 50.1 | 41.1 | X |
| Embodiment 2 | 45.6 | 83.1 | 37.5 | X |
| Embodiment 3 | 98.5 | 83.1 | 15.5 | X |
| Embodiment 4 | 45.6 | 76.5 | 30.9 | X |
| Embodiment 5 | 98.5 | 76.5 | 22.1 | X |
| Embodiment 6 | 6.0 | 44.2 | 38.1 | X |
| Comparative embodiment 1 | 77.5 | 9.0 | 68.4 | ○ |
| Comparative embodiment 2 | 98.5 | 0 | 98.5 | ○ |
| Comparative embodiment 3 | 45.6 | 0 | 45.6 | ○ |
| Comparative embodiment 4 | 45.6 | 23.4 | 22.2 | ○ |
| Comparative embodiment 5 | 45.6 | 10.7 | 34.9 | ○ |
| Comparative embodiment 6 | 6.0 | 65.9 | 59.9 | ○ |

Embodiment 7

An adhesive member was disposed on a 100-μm thick thermoplastic polyurethane film, and then, a display panel was attached to the adhesive member. Next, a 100-μm thick polyurethane was coated on the display panel and was cured to form a first member having a recovery rate of 91.2% and a modulus of 1 MPa. A 100-μm thick polyurethane was coated on the first member and was cured to form a second member having a recovery rate of 50.1% and a modulus of 100 MPa. As a result, a window member according to the embodiment 7 was formed.

Here, the modulus was measured under the following condition.

Sample size: width—25 mm, length—100 mm, thickness—100 μm

Evaluation speed: 50 mm/min

Modulus section: slope of 0.025-0.5% strain section

Embodiments 8 and 9

The display devices according to embodiments 8 and 9 were fabricated in such a way that the first member and the second member had moduli shown in the following table 2. Except for these differences in the moduli, the display devices according to the embodiments 8 and 9 were fabricated using the same method as that in the embodiment 7.

Embodiments 10 to 12

The display devices according to embodiments 10 to 12 were fabricated in such a way that the first member and the second member had thicknesses of 150 μm and had moduli shown in the following table 2. Except for these differences in the thicknesses and moduli, the display devices according to the embodiments 10 to 12 were fabricated using the same method as that in the embodiment 7.

Comparative Embodiment 7 to 9

The display devices according to comparative embodiment 7 to 9 were fabricated in such a way that the first member and the second member had moduli shown in the following table 2. Except for these differences in the recovery rates, the display devices were fabricated using the same method as that in the embodiment 7.

Comparative Embodiments 10 to 12

The display devices according to comparative embodiments 10 to 12 were fabricated in such a way that the first member and the second member had thicknesses of 150 μm and had moduli shown in the following table 2. Except for these differences in the thicknesses and moduli, the display devices according to the comparative embodiments 10 to 12 were fabricated using the same method as that in the embodiment 7.

[Experimental Example 2] Evaluation of Impact Resistance Property According to Modulus and Thickness of Window Member An impact test was performed on display devices, which were fabricated according to the embodiments 7 to 12 and the comparative embodiments 7 to 12. The impact test was performed using pen-drop and ball-drop methods to analyze a critical strain exerted on a display panel, and the results are illustrated in the following table 2. Here, the display device was evaluated to be good, when the critical strain was equal to or less than 0.7%.

In the cases (i.e., the embodiments 7 to 9) where the modulus of the first member was 1 MPa and the modulus of the second member was equal to or larger than 100 MPa, the critical strain exerted on the display panel in the impact ball test was less than 0.7%, and this shows that the display device had a good impact resistance property. In the case (i.e., the embodiment 9) where the modulus of the first member was 1 MPa and the modulus of the second member was 1000 MPa, the critical strains exerted on the display panel in both of the impact ball and impact pen tests were less than 0.7%, and this shows that the display device had a good impact resistance property. By contrast, in the cases (i.e., the comparative embodiments 7 to 9) where the modulus of the first member was 5 MPa, the critical strains exerted on the display panel in both of the impact ball and impact pen tests were larger than 0.7%, and this shows that the display device had a bad impact resistance property.

That is, in the case where each of the first and second members had a thickness of 100 μm or the window member had a thickness of 200 μm, the display device had a good impact resistance property, when the modulus of the first member is 1 MPa and the modulus of the second member is 1000 MPa.

In addition, in the case (i.e., the embodiment 10) where the modulus of the first member was 1 MPa and the modulus of the second member was 100 MPa, the critical strains exerted on the display panel in both of the impact ball and impact pen tests were less than 0.7%, and this shows that the display device had a good impact resistance property.

That is, in the case where each of the first and second members had a thickness of 150 μm or the window member had a thickness of 300 μm, the display device had a good impact resistance property when the modulus of the first member was 1 MPa and the modulus of the second member was 100 MPa.

TABLE 2

|  | First Member Thickness (μm) | Second Member Thickness (μm) | First Member Modulus (MPa) | Second Member Modulus (MPa) | Impact Ball (%) 7 cm | Impact Ball (%) 9 cm | Impact Pen (%) 7 cm | Impact Pen (%) 9 cm |
|---|---|---|---|---|---|---|---|---|
| Embodiment 7 | 100 | 100 | 1 | 100 | 0.6130 | 0.6740 | 1.1350 | 1.347 |
| Embodiment 8 |  |  | 1 | 500 | 0.6243 | 0.6950 | 0.6826 | 0.842 |
| Embodiment 9 |  |  | 1 | 1000 | 0.6103 | 0.6770 | 0.5024 | 0.602 |
| Embodiment 10 | 150 | 150 | 1 | 100 | — | 0.4937 | — | 0.6970 |
| Embodiment 11 |  |  | 1 | 500 | — | — | — | 0.3538 |
| Embodiment 12 |  |  | 1 | 1000 | — | — | — | — |
| Comparative embodiment 7 | 100 | 100 | 5 | 100 | — | 1.3760 | — | 1.636 |
| Comparative embodiment 8 |  |  | 5 | 500 | — | 1.4900 | — | 1.270 |
| Comparative embodiment 9 |  |  | 5 | 1000 | — | 1.4880 | — | 1.099 |
| Comparative embodiment 10 | 150 | 150 | 5 | 100 | — | 1.1650 | — | 0.131 |

TABLE 2-continued

|  | First Member Thickness (μm) | Second Member Thickness (μm) | First Member Modulus (MPa) | Second Member Modulus (MPa) | Impact Ball (%) 7 cm | Impact Ball (%) 9 cm | Impact Pen (%) 7 cm | Impact Pen (%) 9 cm |
|---|---|---|---|---|---|---|---|---|
| Comparative embodiment 11 |  |  | 5 | 500 | — | 1.2200 | — | 0.870 |
| Comparative embodiment 12 |  |  | 5 | 1000 | — | 1.1900 | — | 0.717 |

Embodiments 13 to 17

The display devices according to embodiments 13 to 17 were fabricated in such a way that the first member and the second member had thicknesses and moduli shown in the following table 3. Except for these differences in the thicknesses and moduli, the display devices according to the embodiments 13 to 17 were fabricated using the same method as that in the embodiment 7.

[Experimental Example 3] Evaluation of Impact Resistance Property According to Thickness Ratio and Moduli of First and Second Members An impact test was performed on display devices, which were fabricated according to the embodiments 13 to 27. The impact test was performed using pen-drop and ball-drop methods to analyze a critical strain exerted on the display panel, and the results are illustrated in the following table 3. Here, the display device was evaluated to be good, when the critical strain was equal to or less than 0.7%.

In the embodiments 13 to 17, the modulus of the first member was 1 MPa and the modulus of the second member was equal to or larger than 100 MPa, and in these cases, when the thickness of the first member was equal to or larger than the thickness of the second member (i.e., the embodiments 15 to 17), the critical strain exerted on the display panel in the impact ball test was less than 0.7%, and this shows that the display device had a good impact resistance property.

In the embodiments 18 to 22, the modulus of the first member was 1 MPa and the modulus of the second member was 500 MPa, and in these cases, when the thickness of the first member was equal to or larger than the thickness of the second member (i.e., the embodiments 20 to 22), the critical strain exerted on the display panel in the impact ball test was less than 0.7%, and this shows that the display device had a good impact resistance property.

In the embodiments 23 to 27, the modulus of the first member was 1 MPa and the modulus of the second member was 800 MPa, and in these cases, when the thickness of the first member was equal to or less than the thickness of the second member (i.e., the embodiments 23 to 25), the critical strain exerted on the display panel in the impact pen test was less than 0.7%, and this shows that the display device had a good impact resistance property to the impact pen test. On the other hand, when the thickness of the first member was equal to or larger than the thickness of the second member (i.e., the embodiments 25 to 27), the critical strain exerted on the display panel in the impact ball test was less than 0.7%, and this shows that the display device had a good impact resistance property to the impact ball test.

The results show that when the first and second members have the same thickness, the display device had the best impact resistance property. Furthermore, the results show that when the modulus of the first member was 1 MPa and the modulus of the second member was 800 MPa, the critical strains exerted on the display panel in both of the impact-ball and impact-pen tests can be less than 0.7%, and this shows that the display device had a good impact resistance property.

That is, the results show that, when the first and second members had moduli of 1 MPa and 800 MPa and had the same thickness, the display device had the best impact resistance property. However, the results were obtained from the experiments in which a pen and a ball were dropped from a height of 9 cm, and the acceptance criteria for the impact test may be changed depending on a dropping height of an impact target. Thus, a thickness and a modulus of each member (i.e., the first, second, and window members) may be changed in consideration of the changed acceptance criteria for the impact test.

TABLE 3

|  | First Member Thickness (μm) | Second Member Thickness (μm) | First Member Modulus (MPa) | Second Member Modulus (MPa) | Impact Ball (%) 9 cm | Impact Pen (%) 9 cm |
|---|---|---|---|---|---|---|
| Embodiment 13 | 50 | 150 | 1 | 100 | 0.8071 | 1.2610 |
| Embodiment 14 | 75 | 125 |  |  | 0.7691 | 1.3410 |
| Embodiment 15 | 100 | 100 |  |  | 0.6735 | 1.3470 |
| Embodiment 16 | 125 | 75 |  |  | 0.5981 | 1.4670 |
| Embodiment 17 | 150 | 50 |  |  | 0.5322 | 1.7770 |
| Embodiment 18 | 50 | 150 | 1 | 500 | 0.8899 | 0.7360 |
| Embodiment 19 | 75 | 125 |  |  | 0.8131 | 0.8056 |
| Embodiment 20 | 100 | 100 |  |  | 0.6951 | 0.8423 |
| Embodiment 21 | 125 | 75 |  |  | 0.6099 | 1.075 |
| Embodiment 22 | 150 | 50 |  |  | 0.565 | 1.248 |
| Embodiment 23 | 50 | 150 | 1 | 800 | 0.8799 | 0.5991 |

TABLE 3-continued

|  | First Member Thickness (μm) | Second Member Thickness (μm) | First Member Modulus (MPa) | Second Member Modulus (MPa) | Impact Ball (%) 9 cm | Impact Pen (%) 9 cm |
|---|---|---|---|---|---|---|
| Embodiment 24 | 75 | 125 |  |  | 0.8012 | 0.6349 |
| Embodiment 25 | 100 | 100 |  |  | 0.6844 | 0.6614 |
| Embodiment 26 | 125 | 75 |  |  | 0.6053 | 0.8114 |
| Embodiment 27 | 150 | 50 |  |  | 0.5337 | 1.0170 |

According to some embodiments of the inventive concept, a window member may be configured to have a rollable property and an improved impact resistance property, and a display device may be configured to include such a window member.

While example embodiments of the inventive concept have been particularly shown and described, it will be understood by one of ordinary skill in the art that variations in form and detail may be made therein without departing from the spirit and scope of the attached claims.

What is claimed is:

1. A window member, comprising:
a first member; and
a second member on the first member,
wherein a recovery rate of the second member is 40% or more,
an absolute value of difference in recovery rate between the first and second members is 45% or less,
the window member is shaped to be substantially rollable around a winding core extending in an axial direction of the window member in a rolled state, and
wherein each of the first member and the second member comprises polyurethane and a ratio of an elastic modulus of the first member and the second member is 1:100, 1:500, 1:800, or 1:1000.

2. The window member of claim 1, wherein the recovery rate is measured from the respective first or second member that is stretched by 5%.

3. The window member of claim 1, wherein the elastic modulus of the first member is 1 MPa or less, and
the elastic modulus of the second member is 100 MPa or more.

4. The window member of claim 3, wherein a thickness ratio between the first and second members is 1:1.

5. The window member of claim 1, wherein the winding core is located at an edge of the window member.

6. The window member of claim 5, wherein the first member is rolled with a curvature radius that is less than that of the second member.

7. The window member of claim 6, wherein the second member has a hardness larger than that of the first member.

8. The window member of claim 1, wherein each of the first and second members further comprises at least one of silicone-, and acryl-based materials.

9. The window member of claim 1, wherein both the first member and the second member comprise the same polymer-based materials.

10. A display device, comprising:
a display panel; and
a window member on the display panel,
wherein the window member comprises:
a first member having a first elastic modulus; and
a second member on the first member and having a second elastic modulus larger than the first elastic modulus,
wherein a recovery rate of the second member is 40% or more,
wherein an absolute value of difference in recovery rate between the first and second members is 45% or less, and
the window member is shaped to be substantially rollable around a winding core extending in an axial direction of the window member in a rolled state, and
wherein each of the first member and the second member comprises polyurethane and a ratio of the first elastic modulus and the second elastic modulus is 1:100, 1:500, 1:800, or 1:1000.

11. The display device of claim 10, wherein the recovery rate is measured from the respective first or second member that is stretched by 5%.

12. The display device of claim 10, wherein the first elastic modulus is 1 MPa or less, and
the second elastic modulus is 100 MPa or more.

13. The display device of claim 12, wherein a thickness ratio between the first and second members is 1:1.

14. The display device of claim 10, wherein each of the first and second members further comprises at least one of silicone-, and acryl-based materials.

15. The display device of claim 10, further comprising a winding core located at an edge of the window member, wherein the display panel is shaped to be substantially rollable around the winding core extending in the axial direction of the window member with a curvature radius in the rolled state.

16. The display device of claim 15, wherein the curvature radius is 10 mm or less.

17. The display device of claim 15, wherein a curvature radius of the first member is less than that of the second member, when the window member is in the rolled state.

18. The display device of claim 17, wherein a hardness of the second member is larger than that of the first member.

19. The display device of claim 10, further comprising a protection panel provided below the display panel.

20. The display device of claim 19, further comprising an adhesive member between the display panel and the protection panel.

21. A window member, comprising:
a first member; and
a second member on the first member,
wherein a recovery rate of the second member is 40% or more,
an absolute value of difference in recovery rate between the first and second members is 45% or less, and
wherein each of the first member and the second member comprises polyurethane and each have a different recovery rate, and
wherein a ratio of an elastic modulus of the first member and the second member is 1:100, 1:500, 1:800, or 1:1000.

* * * * *